(12) United States Patent
Camillo-Castillo et al.

(10) Patent No.: US 8,242,584 B2
(45) Date of Patent: Aug. 14, 2012

(54) STRUCTURE AND METHOD TO CREATE STRESS TRENCH

(75) Inventors: Renata A. Camillo-Castillo, Essex Junction, VT (US); Robert J. Gauthier, Jr., Hinesburg, VT (US); Richard A. Phelps, Colchester, VT (US); Robert M. Rassel, Colchester, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/647,796

(22) Filed: Dec. 28, 2009

(65) Prior Publication Data
US 2011/0156223 A1 Jun. 30, 2011

(51) Int. Cl.
*H01L 29/06* (2006.01)
(52) U.S. Cl. ........ 257/649; 257/500; 257/506; 257/510; 257/E29.02; 257/E21.546

(58) Field of Classification Search ........... 257/300–380
See application file for complete search history.

(56) References Cited

U.S. PATENT DOCUMENTS

| 7,232,730 B2 | 6/2007 | Chen et al. | |
|---|---|---|---|
| 2005/0258515 A1 | 11/2005 | Chidambarrao et al. | |
| 2007/0132038 A1 | 6/2007 | Chong et al. | |
| 2007/0164365 A1 | 7/2007 | Chan et al. | |
| 2007/0202654 A1 | 8/2007 | Ajmera et al. | |
| 2008/0150037 A1* | 6/2008 | Teo et al. | 257/374 |
| 2008/0251817 A1* | 10/2008 | Chidambarrao et al. | 257/255 |
| 2008/0272395 A1* | 11/2008 | Banna | 257/190 |
| 2009/0014810 A1* | 1/2009 | Shin et al. | 257/369 |

* cited by examiner

*Primary Examiner* — Mamadou Diallo
(74) *Attorney, Agent, or Firm* — Hoffman Warnick LLC; Anthony Canale

(57) ABSTRACT

An integrated circuit (IC) chip is provided comprising at least one trench including a stress-inducing material which imparts a stress on a channel region of a device, such as a junction gate field-effect transistor (JFET) or a metal-oxide-semiconductor field-effect transistor (MOSFET). A related method is also disclosed.

16 Claims, 3 Drawing Sheets

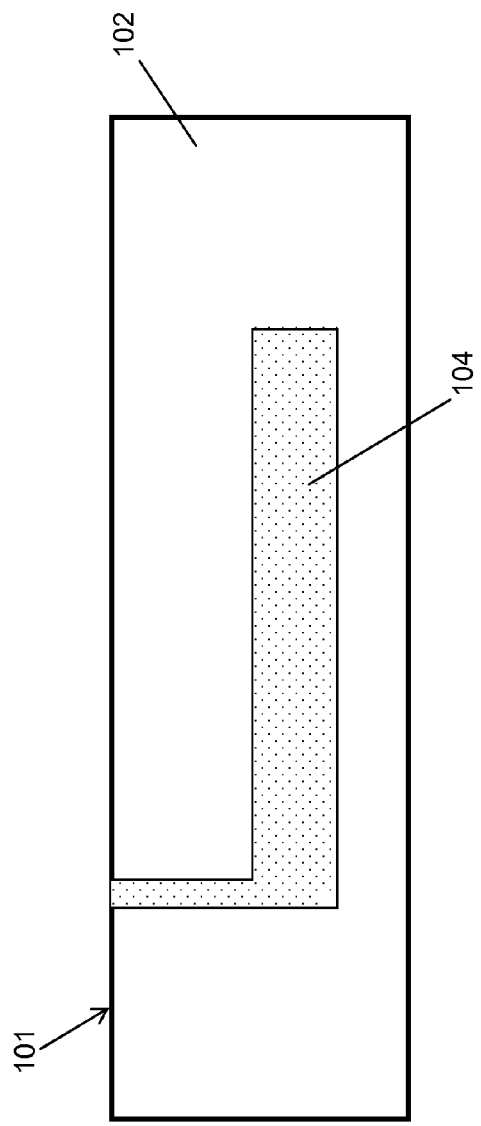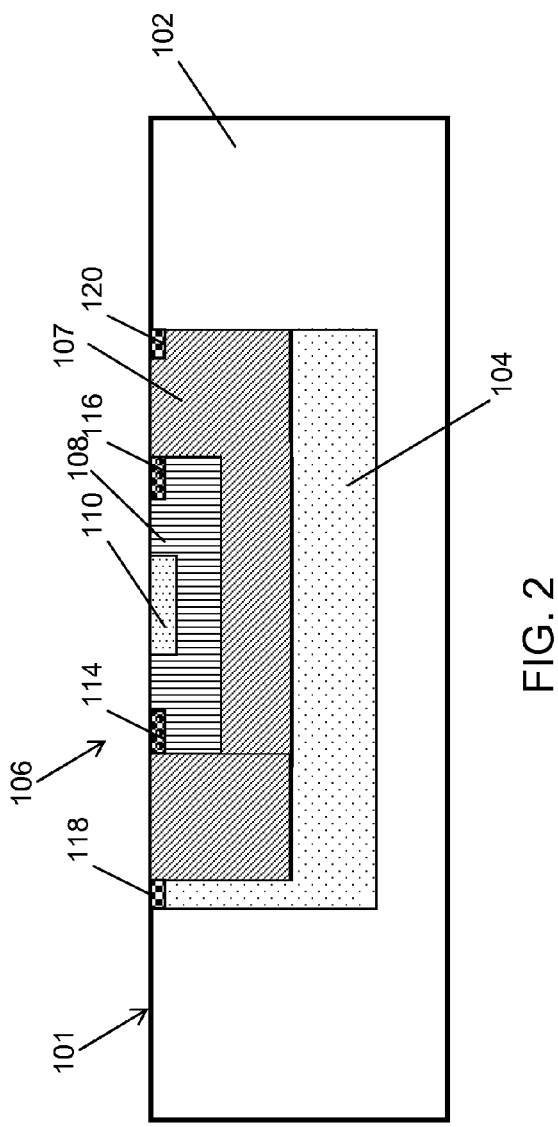

STRUCTURE AND METHOD TO CREATE STRESS TRENCH

FIELD OF THE INVENTION

Embodiments of this invention relate generally to integrated circuit chips and, more particularly, to a chip including a stress trench, and related method.

BACKGROUND

Typically, in semiconductor chip applications, in a field effect transistor (FET), such as a junction gate field-effect transistor (JFET) there is a relationship between the pinchoff voltage $V_p$ (the gate voltage at which the device will no longer conduct between the source and drain) and the on resistance $R_{on}$ (the linear relationship between drain to source voltage and drain current for low drain to source voltage). The relationship is that current methods of reducing $R_{on}$ have the effect of increasing $V_p$. Therefore it is difficult to fabricate a JFET device with a low $V_p$ (ie within the Vdd range of a given technology) while maintaining a low $R_{on}$.

BRIEF SUMMARY

An integrated circuit (IC) chip is provided comprising a trench filled with a stress-inducing material which imparts a stress on a desired region of the IC chip. An embodiment of the invention includes imparting the stress on a channel region of a junction gate field-effect transistor (JFET) or metal-oxide-semiconductor field-effect transistor (MOSFET). A related method is also disclosed.

A first aspect of the disclosure provides an integrated circuit (IC) chip comprising: a device; a trench, adjacent to the device, wherein the trench is includes a stress-inducing material therein which imparts a stress on a channel region of the device.

A second aspect of the disclosure provides a method of imparting a stress onto a device in an integrated circuit (IC), the method comprising: creating a trench adjacent to the device; and at least partially filling the trench with a stress-inducing material which imparts a stress on a channel region of the device.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

FIGS. 1-4 show cross-sectional views of embodiments of a method according to the disclosure.

Figure 3:
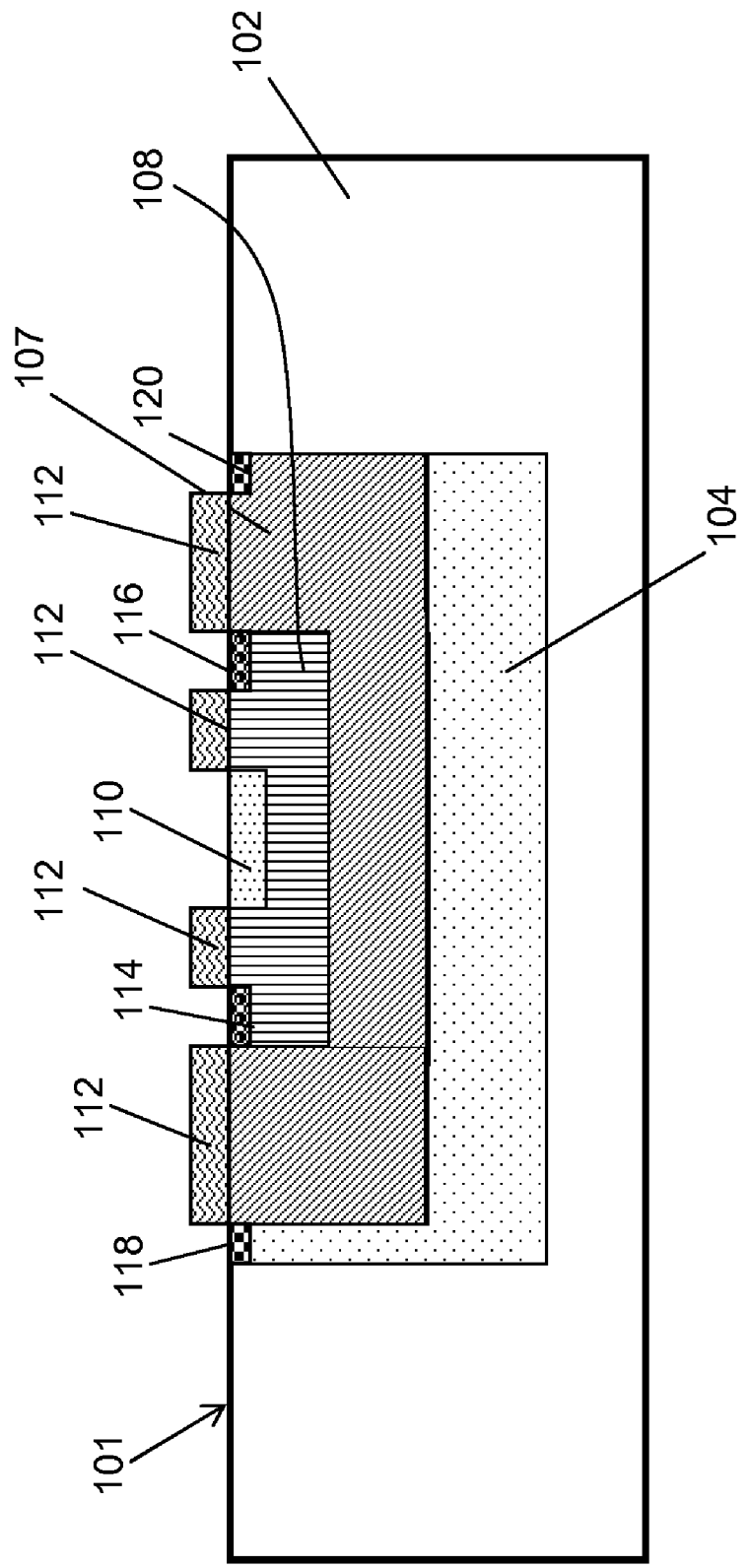

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 4:
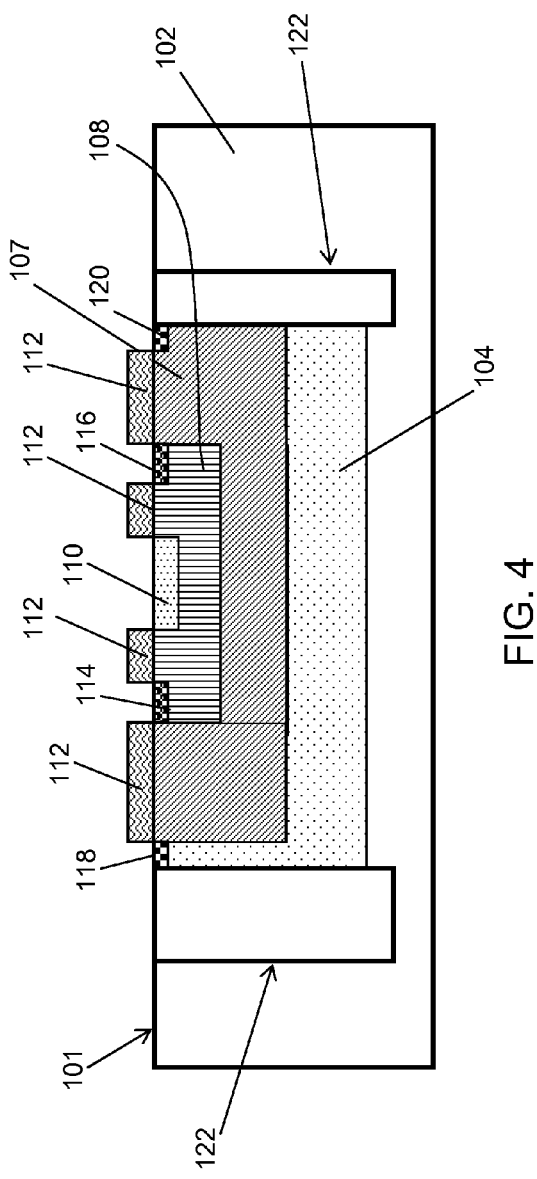
Figure 5:
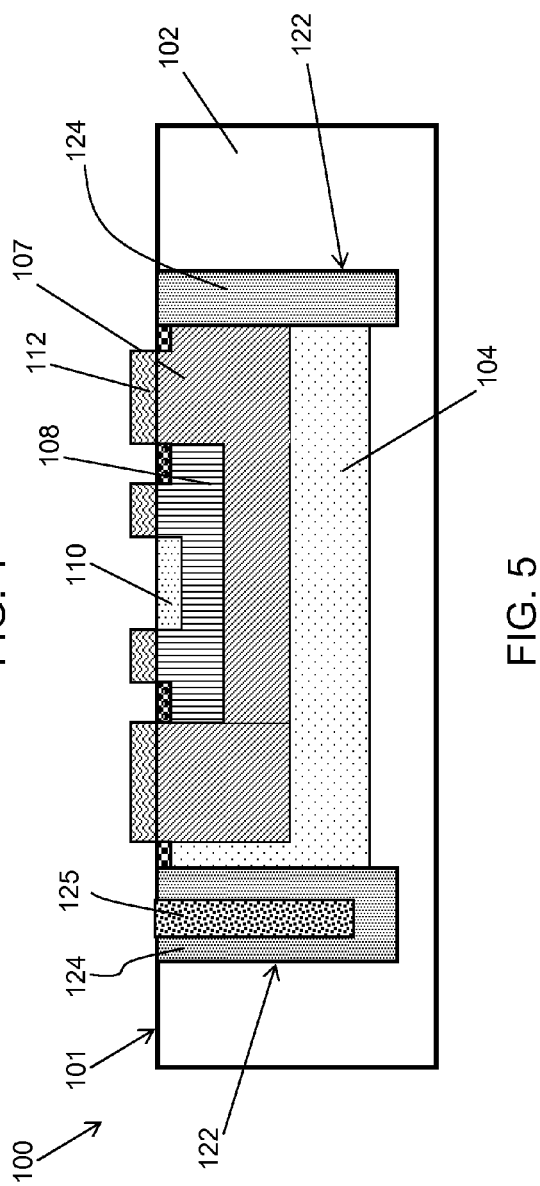
FIG. 5 shows a cross-sectional view of an embodiment of an IC chip according to the disclosure.

FIGS. 1-4 show cross-sectional views of embodiments of a method according to the disclosure, with FIG. 5 showing a cross-sectional view of an embodiment of an IC chip according to the disclosure. Turning to FIG. 1, a substrate 102 is provided. As understood in the art, shallow trench isolations (STI) (not shown) are generated to isolate the region(s) of substrate 102 that will be modified according to embodiments of this invention. Next, substrate 102 is doped as desired to create any layers of desired polarity. For example, an isolation layer 104 can be formed by implanting dopants into the region indicated by isolation layer 104 in FIG. 1. Commonly known dopants can be used, for example, if an n-type isolation layer (in a p-type substrate) is desired, phosphorous can be used as a dopant, while if a p-type isolation layer (in an n-type substrate) is desired, boron could be used as a dopant.

As shown in FIG. 1, isolation layer 104 can be formed such that a portion of isolation layer 104 contacts a top surface 101 of substrate 102 so that a contact 118 (FIG. 2) can be later formed near top surface 101 to contact isolation layer 104, if desired.

In addition, as shown in FIG. 2, a device, such as a JFET 106 can be formed by doping a lower gate region 107, a channel region 108, and an upper gate region 110. Each adjacent layer should be doped with an opposite polarity, i.e., n-type dopants such as phosphorous (P), arsenic (As) or antimony (Sb), or p-type dopants such as boron (B), indium (In) or gallium (Ga), in order to ensure that there is little to no conduction between the layers. For example, if isolation layer 104 is doped with n-type dopants, lower gate region 107 would be doped with p-type dopants, channel region 108 would be doped with n-type dopants, and upper gate region 110 would be doped with p-type dopants. As also shown in FIG. 2, a source 114 and drain 116 can be formed on either side of JFET 106. As understood in the art, the location of source 114 and drain 116 can be reversed without altering the intent of embodiments of this invention. While FIGS. 1-5, and the corresponding discussion herein of embodiments of this invention have been discussed in connection with imparting a stress on a JFET device, it is understood that a stress trench as disclosed herein can be used to impart a stress on any desired region of an IC chip, such as onto regions of a FET device, JFET or MOSFET.

Next, subsequent processing may be conducted to form contacts to the various elements discussed herein. For example, FIG. 2 shows substrate 102 after subsequent processing including forming an isolation contact 118 to contact isolation layer 108, and a lower gate contact 120 to contact lower gate region 106. As the knowledge of how this process is performed is well known, it will not be described in detail here. Upper gate region 110 does not need its own contact region as upper gate region 110 can act as its own contact since it touches upper surface 101 of substrate 102.

It is also noted that a gate oxide step can also be performed, wherein a thin layer of silicon oxide (SiO2) is deposited in the region where JFET 106 will be formed. This thin SiO layer is not shown in the figures, as it is not necessary for illustrating the embodiments of this invention, but it is understood that the inclusion of a thin SiO2 layer is commonly known in the art when working with FET devices.

Next, as shown in FIG. 3, a polysilicon layer 112 is deposited in order to allow certain regions of substrate 102 to be more heavily doped than other regions. Commonly understood masking methods can be used to ensure that polysilicon layer 112 is deposited only on the desired regions, noted as regions 112 in FIG. 3. For example, referring to FIG. 3, areas of substrate 102 that are not directly underneath polysilicon layers 112 are more heavily doped than those areas directly underneath polysilicon layer 112.

Spacers and source/drain extensions can also be formed. Again, these spacers and source/drain extensions are not shown in the figures, as it is not necessary for illustrating the embodiments of this invention, but it is understood that the inclusion of spacers and source/drain extensions is commonly known in the art when working with FET devices.

It is also understood that several diffusion or annealing steps can be performed throughout the process discussed above, as would be understood by one of ordinary skill in the art. Such diffusion or annealing steps would be performed to smooth out the layers and regions discussed herein and to drive in the dopants to ensure that the layers are effective.

Next, according to embodiments of this invention, at least one trench 122 is formed (for example, as shown in FIG. 4, two trenches 122 may be formed, one on either side of JFET 106). Trench 122 can be formed by traditional masking/etching steps, e.g., depositing and patterning a mask and etching trench 122. Trench 122 may be adjacent to the regions of the IC chip on which a stress is to be imparted, i.e., in FIG. 4, adjacent to JFET 106, although isolation layer 104 can be included between JFET 106 and trenches 122 without altering the effects of embodiments of this invention.

Next, as shown in FIG. 5, a stress-inducing layer 124 is deposited at least partially within trench 122. Layer 124 can comprise any now known or later developed silicon nitride stress liner material. Layer 124 may substantially fill trench 122 if trench 122 is sufficiently narrow as shown on the right side of FIG. 5. Where trench 122 is wider, as shown on the left side of FIG. 5, layer 124 may only partially fill trench 122, i.e., it acts as a liner, and any remaining space may be filled with other material such as polysilicon or oxide 125. Any region(s) upon which layer 124 is not desired may be masked in any now known or later developed manner prior to deposition of layer 124. Any required mask may be removed in a conventional manner. Another alternative is that layer 124 may be deposited upon surface 101 (including polysilicon layers 112) and then layer 124 may be selectively removed in any now known or later developed manner from any region(s) upon surface 101 that layer 124 is not desired. Surface 101 may be etched such that layer 124 is flush with the top of trenches 122 and surface 101. Layer 124 can be either compressive or tensile stress inducing, depending on the polarity of channel region 108 of JFET 106. For example, if channel region 108 is p-type, layer 124 would be compressive, and if channel region 108 is n-type, layer 124 would be tensile. Regardless of whether layer 124 is compressive or tensile, stress-inducing layer 124 imparts a stress on the desired region, for example, on channel region 108 of JFET 106.

At least partially filling trenches 122 with stress-inducing layer 124 is preferably done near the end of processing of the IC chip, so that trenches 122 with layer 124 are not exposed to any significant thermal steps that would relax the stress.

FIG. 5 shows IC chip 100 according to an embodiment of this invention, wherein a stress has been imposed on channel region 108 of JFET 106 by stress-inducing layer 124 in two trenches 122. Stress-inducing layer 124 in trenches 122 boosts the stress on the IC chip, especially near surface 101, thereby imparting a stress on channel region 108 of JFET 106. It is also noted that each trench 122 is disposed vertically, i.e., substantially perpendicular to a direction of electric current flow through channel region 108 of JFET 106. Because trenches 122 are vertical, trenches 122 are deep enough to transfer a horizontal stress, for example, at least 1 GPa, into channel region 108 of JFET 106. The magnitude of the stress imparted can vary as desired by commonly known methods such as by varying the deposition temperature (stress caused by a thermal mismatch) and/or by varying the composition of the nitride film material, e.g., $Si_xN_y$, where $x+y=1$ (lattice mismatch).

Embodiments of this invention include a method of fabricating a device using a stress liner structure put in after front-end-of-line (FEOL) fabrication is complete which has applied stress of the appropriate sign/magnitude in the channel of the device to enhance the electron mobility and therefore reduce Ron. This applied stress does not have affect Vp and therefore Vp does not go up with the decreased Ron.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit (IC) chip comprising:
   a junction gate field-effect transistor (JFET) having a top gate, a bottom gate, and a channel region therebetween;
   a trench, adjacent to the JFET, wherein the trench includes a stress-inducing material therein which imparts a horizontal stress on the channel region of the JFET, and wherein the trench extends deeper into the chip than the JFET.

2. The IC chip of claim 1, wherein the trench comprises a pair of trenches, each trench adjacent to the JFET.

3. The IC chip of claim 1, wherein the trench is disposed substantially perpendicular to a direction of electric current flow through the channel region of the JFET.

4. The IC chip of claim 1, wherein the stress-inducing material comprises a silicon nitride stress liner.

5. The IC chip of claim 1, wherein the stress-inducing material is substantially flush with a top surface of the IC chip.

6. The IC chip of claim 1, wherein the stress-inducing material imparts a compressive stress in the case that the channel region of the JFET includes p-type dopants, and the stress-inducing material imparts a tensile stress in the case that the channel region of the JFET includes n-type dopants.

7. The IC chip of claim 1, wherein the stress inducing material substantially fills the trench.

8. The IC chip of claim 1, wherein the horizontal stress imparted on the channel region of the JFET is at least approximately 1 GPa.

9. A method of imparting a stress onto a junction gate field-effect transistor (JFET) having a top gate, a bottom gate, and a channel region therebetween in an integrated circuit (IC) chip, the method comprising:
   creating a trench adjacent to the JFET, wherein the trench extends deeper into the chip than the JFET; and
   at least partially filling the trench with a stress-inducing material which imparts a horizontal stress on the channel region of the JFET.

10. The method of claim 9, wherein the creating includes creating a pair of trenches, each trench adjacent to the JFET.

11. The method of claim 9, wherein the trench is disposed substantially perpendicular to a direction of electric current flow through the channel region of the JFET.

12. The method of claim 9, wherein the stress-inducing material comprises a silicon nitride stress liner.

13. The method of claim 9, further comprising etching a top surface of the IC chip such that the stress-inducing material is substantially flush with the top surface of the IC chip.

14. The method of claim 9, wherein the stress-inducing material imparts a compressive stress in the case that the channel region of the JFET includes p-type dopants, and the stress-inducing material imparts a tensile stress in the case that the channel region of the JFET includes n-type dopants.

15. The method of claim 9, wherein the at least partially filling includes substantially filling the trench with the stress-inducing material.

16. The method of claim 9, wherein the horizontal stress imparted on the channel region of the JFET is at least approximately 1 GPa.

* * * * *